(12) United States Patent
Oh et al.

(10) Patent No.: US 7,122,841 B2
(45) Date of Patent: Oct. 17, 2006

(54) BONDING PAD FOR GALLIUM NITRIDE-BASED LIGHT-EMITTING DEVICES

(75) Inventors: Tchang-Hun Oh, Sharon, MA (US); Hong K. Choi, Sharon, MA (US); John C. C. Fan, Brookline, MA (US); Jagdish Narayan, Raleigh, NC (US)

(73) Assignee: Kopin Corporation, Taunton, MA (US)

( * ) Notice: Subject to any disclaimer, the term of this patent is extended or adjusted under 35 U.S.C. 154(b) by 68 days.

(21) Appl. No.: 10/860,798

(22) Filed: Jun. 3, 2004

(65) Prior Publication Data

US 2004/0262621 A1    Dec. 30, 2004

Related U.S. Application Data

(60) Provisional application No. 60/475,759, filed on Jun. 4, 2003.

(51) Int. Cl.
*H01L 27/15* (2006.01)
(52) U.S. Cl. .............................. 257/81; 257/94; 257/99
(58) Field of Classification Search ...................... None
See application file for complete search history.

(56) References Cited

U.S. PATENT DOCUMENTS

| | | |
|---|---|---|
| 4,153,905 A | 5/1979 | Charmakadze et al. |
| 4,495,514 A | 1/1985 | Lawrence et al. |
| 4,625,182 A | 11/1986 | Bovino et al. |
| 4,670,088 A | 6/1987 | Tsaur et al. |
| 4,946,548 A | 8/1990 | Kotaki et al. |
| 4,966,862 A | 10/1990 | Edmond |
| 5,091,333 A | 2/1992 | Fan et al. |
| 5,210,051 A | 5/1993 | Carter, Jr. |
| 5,239,188 A | 8/1993 | Takeuchi et al. |
| 5,247,533 A | 9/1993 | Okazaki et al. |

(Continued)

FOREIGN PATENT DOCUMENTS

DE    24 21 590 A    11/1975

(Continued)

OTHER PUBLICATIONS

Chichibu, S., et al., "Exciton Localization in InGaN Quantum Well Devices," *J. Vac. Sci. Technol B.*, vol. 16(4):2204-2214 (1998).

(Continued)

*Primary Examiner*—Wai-Sing Louie
(74) *Attorney, Agent, or Firm*—Hamilton, Brook, Smith & Reynolds, P.C.

(57) ABSTRACT

A semiconductor device includes a substrate having a first major surface; a semiconductor device structure over the first surface of the substrate, the device structure comprising an n-type semiconductor layer, and a p-type semiconductor layer over the n-type semiconductor layer; a p-side electrode having a first and a second surface, wherein the first surface is in electrical contact with the p-type semiconductor layer; and a p-side bonding pad over the p-side electrode. Preferably, the semiconductor device further comprises an n-side bonding pad over an n-type semiconductor layer. The p-side and n-side bonding pads each independently includes a gold layer as its top layer and a single or multiple layers of a diffusion barrier under the top gold layer. Optionally, one or more metal layers are further included under the diffusion barrier. Typically, the p-side bonding pad is formed on the p-side electrode. The n-side bonding pad typically is formed on the n-type semiconductor layer, and forms a good ohmic contact with the n-type semiconductor layer.

25 Claims, 4 Drawing Sheets

U.S. PATENT DOCUMENTS

| | | |
|---|---|---|
| 5,252,499 A | 10/1993 | Rothschild |
| 5,272,108 A | 12/1993 | Kozawa |
| 5,278,433 A | 1/1994 | Manabe et al. |
| 5,281,830 A | 1/1994 | Kotaki et al. |
| 5,285,078 A | 2/1994 | Mimura et al. |
| 5,290,393 A | 3/1994 | Nakamura |
| 5,306,662 A | 4/1994 | Nakamura et al. |
| 5,323,022 A | 6/1994 | Glass et al. |
| 5,334,277 A | 8/1994 | Nakamura |
| 5,369,289 A | 11/1994 | Tamaki et al. |
| 5,383,088 A | 1/1995 | Chapple-Sokol et al. |
| 5,385,862 A | 1/1995 | Moustakas |
| 5,406,123 A | 4/1995 | Narayan |
| 5,408,120 A | 4/1995 | Manabe et al. |
| 5,433,169 A | 7/1995 | Nakamura |
| 5,442,205 A | 8/1995 | Brasen et al. |
| 5,455,195 A | 10/1995 | Ramsey et al. |
| 5,468,678 A | 11/1995 | Nakamura et al. |
| 5,516,731 A | 5/1996 | Toutounchi et al. |
| 5,563,422 A | 10/1996 | Nakamura et al. |
| 5,578,839 A | 11/1996 | Nakamura et al. |
| 5,637,530 A | 6/1997 | Gaines et al. |
| 5,652,434 A | 7/1997 | Nakamura et al. |
| 5,656,832 A | 8/1997 | Ohba et al. |
| 5,686,738 A | 11/1997 | Moustakas |
| 5,726,462 A | 3/1998 | Spahn et al. |
| 5,733,796 A | 3/1998 | Manabe et al. |
| 5,734,182 A | 3/1998 | Nakamura et al. |
| 5,747,832 A | 5/1998 | Nakamura et al. |
| 5,751,752 A | 5/1998 | Shakuda |
| 5,760,423 A | 6/1998 | Kamakura et al. |
| 5,767,581 A | 6/1998 | Nakamura et al. |
| 5,777,350 A | 7/1998 | Nakamura et al. |
| 5,828,684 A | 10/1998 | Van de Walle |
| 5,834,326 A | 11/1998 | Miyachi et al. |
| 5,834,331 A | 11/1998 | Razeghi |
| 5,850,410 A | 12/1998 | Kuramata |
| 5,877,558 A | 3/1999 | Nakamura et al. |
| 5,880,486 A | 3/1999 | Nakamura et al. |
| 5,900,650 A | 5/1999 | Nitta |
| 5,905,276 A | 5/1999 | Manabe et al. |
| 5,959,307 A | 9/1999 | Nakamura et al. |
| 5,998,925 A | 12/1999 | Shimizu et al. |
| 6,001,669 A | 12/1999 | Gaines et al. |
| 6,017,774 A | 1/2000 | Yuasa et al. |
| 6,051,849 A | 4/2000 | Davis et al. |
| 6,060,335 A | 5/2000 | Rennie et al. |
| 6,066,861 A | 5/2000 | Höhn et al. |
| 6,067,222 A | 5/2000 | Hausmann |
| 6,067,309 A * | 5/2000 | Onomura et al. ........ 372/46.01 |
| 6,069,440 A | 5/2000 | Shimizu et al. |
| 6,078,063 A | 6/2000 | Nakamura et al. |
| 6,084,899 A | 7/2000 | Shakuda |
| 6,093,965 A | 7/2000 | Nakamura et al. |
| 6,097,040 A | 8/2000 | Morimoto et al. |
| 6,115,399 A | 9/2000 | Shakuda |
| 6,118,801 A | 9/2000 | Ishikawa et al. |
| 6,153,010 A | 11/2000 | Kiyoku et al. |
| 6,153,894 A | 11/2000 | Udagawa |
| 6,172,382 B1 | 1/2001 | Nagahama et al. |
| 6,204,512 B1 | 3/2001 | Nakamura et al. |
| 6,215,133 B1 | 4/2001 | Nakamura et al. |
| 6,222,871 B1 | 4/2001 | Chang-Hasnain et al. |
| 6,238,943 B1 | 5/2001 | Kobayashi et al. |
| 6,241,344 B1 | 6/2001 | Machida |
| 6,245,259 B1 | 6/2001 | Höhn et al. |
| 6,249,012 B1 | 6/2001 | Manabe et al. |
| 6,255,129 B1 | 7/2001 | Lin |
| 6,268,618 B1 | 7/2001 | Miki et al. |
| 6,287,947 B1 | 9/2001 | Ludowise et al. |
| 6,337,493 B1 | 1/2002 | Tanizawa et al. |
| 6,344,665 B1 | 2/2002 | Sung et al. |
| 6,362,017 B1 | 3/2002 | Manabe et al. |
| 6,403,987 B1 | 6/2002 | Miki et al. |
| 6,410,942 B1 | 6/2002 | Thibeault et al. |
| 6,417,525 B1 | 7/2002 | Hata |
| 6,445,127 B1 | 9/2002 | Oku et al. |
| 6,475,854 B1 | 11/2002 | Narwankar et al. |
| 6,495,862 B1 | 12/2002 | Okazaki et al. |
| 6,521,999 B1 | 2/2003 | Uemura et al. |
| 6,531,383 B1 | 3/2003 | Lee |
| 6,555,457 B1 | 4/2003 | Derkits, Jr. et al. |
| 6,734,091 B1 | 5/2004 | Oh et al. |
| 6,806,111 B1 * | 10/2004 | Ehrichs et al. ................ 438/29 |
| 2001/0022367 A1 | 9/2001 | Nakamura et al. |
| 2001/0028062 A1 | 10/2001 | Uemura et al. |
| 2001/0030318 A1 | 10/2001 | Nakamura et al. |
| 2001/0032976 A1 | 10/2001 | Ishikawa et al. |
| 2001/0050375 A1 | 12/2001 | Van Dalen |
| 2002/0001864 A1 | 1/2002 | Ishikawa et al. |
| 2002/0046693 A1 | 4/2002 | Kiyoku et al. |
| 2002/0047128 A1 | 4/2002 | Song et al. |
| 2002/0060326 A1 | 5/2002 | Manabe et al. |
| 2002/0182765 A1 | 12/2002 | Tran et al. |
| 2003/0160246 A1 | 8/2003 | Narayan et al. |
| 2003/0199171 A1 | 10/2003 | Rice et al. |
| 2003/0222263 A1 | 12/2003 | Choi |
| 2004/0000670 A1 | 1/2004 | Oh et al. |
| 2004/0000671 A1 | 1/2004 | Oh et al. |
| 2004/0000672 A1 | 1/2004 | Fan et al. |

FOREIGN PATENT DOCUMENTS

| | | |
|---|---|---|
| DE | 33 45 172 A1 | 7/1985 |
| DE | 199 34 031 A | 5/2000 |
| DE | 199 11 717 A1 | 9/2000 |
| DE | 100 60 439 A | 6/2002 |
| EP | 0 356 059 A2 | 2/1990 |
| EP | 0 483 688 A2 | 5/1992 |
| EP | 0 483 688 B1 | 5/1992 |
| EP | 0 513 745 A2 | 11/1992 |
| EP | 622 858 A2 | 11/1994 |
| EP | 1 168 460 A2 | 1/2002 |
| JP | 52/028887 | 3/1977 |
| JP | 54-093380 | 7/1979 |
| JP | 59-228776 | 12/1984 |
| JP | 61-056474 | 3/1986 |
| JP | 02-229475 | 9/1990 |
| JP | 2229475 | 9/1990 |
| JP | 03-203388 | 9/1991 |
| JP | 03-218625 | 9/1991 |
| JP | 03-252177 | 11/1991 |
| JP | 04-068579 | 3/1992 |
| JP | 4209577 | 7/1992 |
| JP | 04-242985 | 8/1992 |
| JP | 4236478 | 8/1992 |
| JP | 05-243614 | 9/1993 |
| JP | 06-021511 | 1/1994 |
| JP | 06-177423 | 6/1994 |
| JP | 06-268259 | 9/1994 |
| JP | 8167735 | 6/1996 |
| JP | 8213692 | 8/1996 |
| JP | 8306643 | 11/1996 |
| JP | 8306958 | 11/1996 |
| JP | 8316527 | 11/1996 |
| JP | 9092880 | 4/1997 |
| JP | 9134881 | 5/1997 |
| JP | 9167857 | 6/1997 |
| JP | 11145513 | 5/1999 |
| JP | 2001 015811 A | 1/2001 |
| WO | WO 88/00392 | 1/1988 |
| WO | WO 01/47038 A1 | 6/2001 |
| WO | WO 01/73858 A1 | 10/2001 |

WO WO 02/09185 A1 1/2002

OTHER PUBLICATIONS

Chen, L., et al., "Fabrication of 50-100 nm Patterned InGaN Blue Light Emitting Heterostructures," *IEEE, 14th Annual Meeting of the IEEE Lasers & Electro-Optics Society*, 1:760-761 (2001).

Cho, H. K., et al., "Influence of Strain-Induced Indium Clustering on Characteristics of InGaN/GaN Multiple Quantum Wells with High Indium Composition," *Journal of Applied Physics*, 91(3):1104-1107 (2002).

Narayan, J. and H. Wang, "Effect of Thickness Variation in High-Efficiency InGaN/GaN Light-Emitting Diodes," *Applied Physics Letters*, 81(5): 841-843 (2002).

Kim, H., et al., "Design and Fabrication of Highly Efficient GaN-Based Light-Emitting Diodes," *IEEE Transactions on Electron Devices*, 49(10):1715-1722 (2002).

Maeda, T., et al., "Effects of NiO on Electrical Properties of NiAu-Based Ohmic Contacts for *p*-type GaN," *Applied Physics Letters* 75(26):4145-4147 (1999).

Foresi, J.S. and Moustakas, T.D., "Metal contacts to gallium nitride," *Appl. Phys. Lett.* 62(22):2859-2861 (1993).

Nakamura, S., "InGaN blue-light-emitting diodes," *Journal of the Institute of Electronics, Information and Communication Engineers* 76(9):913-917 (1993) (Abstract).

Akasaki, I. and Amano, H., "High efficiency UV and blue emitting devices preared by MOVPE and low energy electron beam irradiation treatment," *Physical Concepts of Materials for Novel Optoelectronic Device Applications*, 1361:138-149 (1990).

Amano, H., et al., "P-Type Conduction in Mg-Doped GaN Treated with Low-Energy Electron Beam Irradiation (LEEBI)", *Japanese Journal of Applied Physics* 28(12):L2112-L2114 (1989).

Andreev, V.M., et al., "Luminescence Properties of i-n, i-n-i and n-i-n Structures Made of Epitaxial Layers GaN/α-$Al_2O_3$," *Journal of Luminescence* 35:9-16 (1986).

Boulou, M., et al., "Recombination Mechanisms in GaN:Zn," *Journal of Luminescence* 18/19:767-770 (1979).

Casey, Jr., H.C. and Panish, M.B., "SLAB-Dielectric Waveguides," in *Heterostrcutures Lasers*, (NY: Academic Press), pp. 32-35 (1978).

Goldenberg, B., et al., "Ultraviolet and violet light-emitting GaN diodes grown by low-pressure metalorganic chemical vapor deposition," *Appl. Phys. Lett.* 62(4):381-383 (1993).

F. Goodenough, "Exotic Semiconductors Showcased at the IEDM," *Electronic Design*, pp. 60, 62, 64-66, 68 (1994).

Hayashi, I., et al., "Junction Lasers Which Operate Continuously at Room Temperature," *Appl. Phys. Lett.* 17(3):109-111 (1970).

Jacob, G., et al., "GaN Electroluminescent Devices: Preparation and Studies," *Journal of Luminescence* 17:263-282 (1978).

Jang, J.-S., et al., "High Quality Non-Alloyed Pt Ohmic Contacts to *P*-Type GaN Using Two-Step Surface Treatment," *MRS Internet J. Nitride Semiconductor Res. F99W10.4*.

Kaminska, E., et al., "Ni/Si-Based Contacts to GaN: Thermally Activated Structural Transformations Leading to Ohmic Behavior," *MRS Internet J. Nitride Semicond. Res. 4S1, G9.9*.

Kampen, T.U. and Mönch, W., "Metal Contacts on a-GaN," *MRS Internet J. Nitride Semicond. Res. 1(41)*.

Madar, R., "High Pressure Solution Growth of GaN+," *Journal of Crystal Growth* 31:197-203 (1975).

Matsuoka, T., "Growth and Properties of a Wide-Gap Semiconductor InGaN," *Optoelectronics* 5(1):53-64 (1990).

T. Matsuoka, "Current status of GaN and related compounds as wide-gap semiconductors," *Journal of Crystal Growth* 124:433-438 (1992).

Nakamura, S., et al., "High-power InGaN/GaN double-heterostructure violet light emitting diodes," *Appl. Phys. Lett.* 62(19):2390-2392 (1993).

Nakamura, S., et al., "P-GaN/N-InGaN/N-GaN Double-Heterostructure Blue-Light Emitting Diodes," *Jpn. J. Appl. Phys.* 32:L8-L11 (1993).

S. Nakamura, "Growth of $In_xGa_{(1-x)}N$ compound semiconductors and high-power InGaN/AlGaN double heterostructure violet-light-emitting diodes," *Microelectronics Journal* 25:651-659 (1994).

Nakamura, S., et al., "High-Power GaN P-N Junction Blue-Light-Emitting Diodes," *Japanese Journal of Applied Physics* 30 (12A):L1998-L2001 (1991).

Nakamura, S., "InGaN/AlGaN Double-Heterostructure Blue LEDs," *Mat. Res. Soc. Symp. Proc.* vol. 339:173-178 (1994).

Nakamura, S., et al., "Thermal Annealing Effects on P-Type Mg-Doped GaN Films," *Jpn. J. Appl. Phys.* 31:L139-L142 (1992).

Nakamura, S., "Zn-doped InGaN growth and InGaN/AlGaN double-heterostructure blue-light-emitting diodes," *Journal of Crystal Growth* 145:911-917 (1994).

Nakamura, S., et al., "High-brightness InGaN/AlGaN double-heterostructure blue-green-light-emitting diodes," *J. Appl. Phys.* 76(12):8189-8191 (1994).

Nakamura, S., et al., "Cd-Doped InGaN Films Grown on GaN Films," *Jpn. J. Appl. Phys.* 32:L338-L341 (1993).

Nakamura, S., "High-Power InGaN/AlGaN Double-Heterostructure Blue-Light-Emitting Diodes," *Int'l Electronic Devices Meeting* 94:567-570 (1994).

Piotrowska, A., et al., "Ohmic Contacts to III-V Compound Semiconductors: A Review of Fabrication Techniques," *Solid-State Electronics* 26(3):179-197 (1983).

Sporken, R., et al., "XPS study of Au/GaN and Pt/GaN contacts," *MRS Internet J. Nitride Semiconductor Res.* 2(23)(1997).

Venugopalan, H.S., et al., "Phase Formation and Morphology in Nickel and Nickel/Gold Contacts To Gallium Nitride," MRS Internet Journal Nitride Semiconductor Research (1997) <URL:http://nsr.mij.mrs.org/MRS/S97-D/4.10>.

Zhou, L., et al., "Characteristics of Ti/Pt/Au Ohmic Contacts on *p*-type GaN/$Al_xGa_{1-x}N$ Superlattices," *MRS Internet J. Nitride Semicond. Res. F99W10.3*.

Dovidenko, K., et al., "Aluminum nitride films on different orientations of sapphire and silicon," *J. Appl. Phys.* 79(5): 2349-2445, (1996).

Jain, S.C., et al., "Applied Physics Reviews/III—nitrides: Growth, characterization, and properties," *J. Appl. Phys.* 87(3): 965-1006, (2000).

Lin, Y.S., et al., "Dependence of composition fluctuation on indium content in InGaN/GaN multiple quantum wells," *Appl. Phys. Lett.*, 77(19): 2988-2990, (2000).

Narukawa, Y., et al., "Dimensionality of excitons in laser-diode structures composed of $In_xGa_{1-x}N$ multiple quantum wells," *Phys. Rev. B*, 59(15): 10283-10288, (1999).

Kawakami, Y., et al., "Dynamics of optical gain in $In_xGa_{1-x}N$ multi-quantum well-based laser diodes," *Appl. Phys. Lett.*, 77(14): 2151-2153, (2000).

Strite, S., and Morkoc, H., "GaN, AlN, and InN: A review," *J. Vac. Sci. Technol. B*, 10(4):1237-1266, (1992).

Hassan, K.M., et al., "Optical and structural studies of Ge nanocrystals embedded in AlN matrix fabricated by pulsed laser deposition," *Appl. Phys. Lett.*, 75(9): 1222-1224, (1999).

Teng, C.W., et al., "Quantum confinement of $E_1$ and $E_2$ transitions in Ge quantum dots embedded in an $Al_2O_3$ or AlN matrix," *App. Phys. Lett.*, 76(1): 43-45, (2000).

Narukawa, Y., et al., "Role of self-formed InGaN quantum dots for exciton localization in the purple laser diode emitting at 420 nm," *Appl. Phys. Lett.*, 70(8): 981-983, (1997).

Nakamura, S., "The Roles of Structural Imperfections in InGaN-Based Blue Light-Emitting Diodes and Laser Diodes," *Science Magazine*, 1-14, [retrieved online Aug. 8, 2000]. Retrieved from the Internet <URL: http://www.science.org/cgi/content/full/281/5379/956>.

Chichibu, S., et al., "Spatially resolved cathodoluminescence spectra of InGaN quantum wells," *App. Phys. Lett.*, 71(16): 2346-2348, (1997).

Queisser, H.J., et al., "Defects in Semiconductors: Some Fatal, Some Vital," *Science*, 281:945-950 (1998).

LeGoues, F. K., et al.,"Cyclic Growth of Strain-Relaxed Islands," *Physical Review Letters*, 73(2):300-303 (1994).

Mahajan, S., "Defects in Semiconductors and Their Effects on Devices," *Acta Materialia*, 48:137-149 (2000).

Matthews, J.W., et al., "Defects in Epitaxial Multilayers," *Journal of Crystal Growth*, 27:118-125 (1974).

Narayan, J., et al., "Mechanism of Formation of 60° and 90° Misfit Dislocations in Semiconductor Heterostructures," *Materials Science and Engineering,* B10:261-267 (1991).

Narayan, J., et al., "Epitaxial Growth of TiN Films on (100) Silicon Substrates by Laser Physical Vapor Deposition," *Applied Physics Letters,* 61(11):1290-1293 (1992).

Matthews, J.W., "Coherent Interfaces and Misfit Dislocations," In *Epitaxial Growth Part B,* (Academic Press New York) Ch. 8, pp. 560-609 (1975).

* cited by examiner

BONDING PAD FOR GALLIUM NITRIDE-BASED LIGHT-EMITTING DEVICES

RELATED APPLICATION

This application claims the benefit of U.S. Provisional Application No. 60/475,759, filed Jun. 4, 2003. The entire teachings of this application are incorporated herein by reference.

BACKGROUND OF THE INVENTION

In a semiconductor device, such as a light-emitting diode (LED) or laser diode (LD), a layer of an n-type semiconductor material and a layer of a p-type semiconductor material are sequentially stacked on a suitable substrate, such as gallium arsenide, indium phosphide, silicon carbide or sapphire. In general, the n-type semiconductor layer is formed over the substrate layer, and the p-type semiconductor layer is formed above the n-type layer. In a typical example of an LED, a p-side electrode layer is formed on the p-type semiconductor layer, through which light is observed. In this device, the p-electrode layer must be very thin in order to be light transmissive, and thus, it is difficult to attach a bonding wire directly to it. Accordingly, a bonding pad is commonly used to attach the bonding wire, such as a gold wire, to the p-side electrode.

The bonding pad and electrode include one or more metal layers. Examples of the metal materials include nickel, copper, palladium, platinum and aluminum. In general, the top layer of the bonding pad is a gold layer because it can form a good bond with a gold wire. These metal layers are annealed at high temperature, for example, above 400° C. to obtain highly desirable electrical properties. During the high-temperature annealing process, metals in the bonding pad or in the electrode under the bonding pad, such as nickel, copper, palladium, platinum and aluminum, diffuse to the top surface of the bonding pad. In particular, nickel, copper, palladium, platinum and aluminum have a large diffusion coefficient through the grain boundaries of a top layer, for example, a gold layer, and diffusion of these materials can occur at temperatures as low as 100° C. The metal materials that diffuse to the top surface of the bonding pad are now subject to oxidation through various heat and/or chemical treatments associated with the fabrication of the semiconductor devices, rendering the surface of the bonding pad less suitable for subsequent wire bonding.

Similarly, diffusion of metal materials can also occur in an n-side electrode over an n-type semiconductor layer and a bonding pad for the n-side electrode or for the n-type semiconductor material during, for example, high temperature annealing, thereby weakening the bonding strength between a bonding wire and the bonding pad.

Therefore, there is a need for developing methods for reducing or preventing diffusion of oxidizable metal materials to the top surfaces of bonding pads.

SUMMARY OF THE INVENTION

The present invention is directed to a semiconductor device, a method for producing the semiconductor device and a bonding pad for use in the semiconductor device.

In one embodiment of the invention, the semiconductor device comprises a substrate having a first major surface; a semiconductor device structure over the first major surface of the substrate; a p-side electrode having a first and a second surface, where the first surface is in electrical contact with the p-type semiconductor layer; a p-side bonding pad that is in contact with the second surface of the p-side electrode. The semiconductor device structure comprises an n-type semiconductor layer and a p-type semiconductor layer over the n-type semiconductor layer. The p-side bonding pad includes a top gold layer having a first and a second surface, where the first surface is the top surface of the p-side bonding pad; and a single or multiple layers of a p-side diffusion barrier in contact with the second surface of the top gold layer.

In another embodiment of the invention, the semiconductor device further includes an n-side bonding pad that is directly on a surface of the n-type semiconductor layer and forms an ohmic contact with the underlying n-type semiconductor. The n-side bonding pad comprises a top gold layer having a first and a second surface, where the first surface is the top surface of the p-side bonding pad, and a single or multiple layers of a p-side diffusion barrier is in contact with the second surface of the top gold layer.

In another embodiment, the invention is directed to a method for producing a semiconductor device. The method includes the steps of: forming a semiconductor device structure over a first major surface of a substrate, the device structure including an n-type semiconductor layer and a p-type semiconductor layer over the n-type semiconductor layer; forming a p-side electrode in electrical contact with the p-type semiconductor layer; forming a single or multiple layers of a p-side diffusion barrier over the p-side electrode, wherein the p-side diffusion barrier includes at least one element selected from the group consisting of tungsten, tantalum, molybdenum, chromium and titanium; and forming a gold layer over the p-side diffusion barrier.

In yet another embodiment of the invention, the method for producing a semiconductor device further includes the steps of forming a single or multiple layers of an n-side diffusion barrier over the n-type semiconductor layer, where the n-side diffusion barrier includes at least one element selected from the group consisting of tungsten, tantalum, molybdenum, chromium and titanium; and forming a second top gold layer over the n-side diffusion barrier.

In a preferred embodiment, the invention is directed to a method for producing a semiconductor device that includes p-side and n-side bonding pads. In this embodiment, the p-side and n-side bonding pads includes the same set of materials, and are formed simultaneously. The method of this embodiment comprises the steps of: forming a semiconductor device structure over a first major surface of a substrate, the device structure comprising an n-type semiconductor layer and a p-type semiconductor layer over the n-type semiconductor layer; forming a p-side electrode in electrical contact with the p-type semiconductor layer; and forming the p-side bonding pad and n-side bonding pad simultaneously. The formation of the p-side and n-side bonding pads comprises the steps of: forming a single or multiple layers of a diffusion barrier over the p-side electrode and the n-type semiconductor layer, wherein the diffusion barrier includes at least one element selected from the group consisting of tungsten, tantalum, molybdenum, chromium and titanium; and forming a gold layer over the diffusion barrier.

The present invention also provides a bonding pad for a semiconductor material, preferably gallium nitride-based semiconductor material, which can be used in a semiconductor device. The bonding pad comprises a top gold layer having a first and a second surface, where the first surface is the top surface of the p-side bonding pad; a single or multiple layers of a diffusion barrier in contact with the second surface of the top gold layer, and optionally one or more metal layers under the diffusion barrier, each of the metal layers independently selected from the group consisting of gold, palladium, aluminum and a mixture thereof. The diffusion barrier includes at least one element selected from the group consisting of tungsten, tantalum, molybdenum, chromium and titanium.

The bonding pad of the present invention includes a diffusion barrier that can essentially block the diffusion of underlying metallic materials to its top surface and subsequent oxidation of the metallic materials. Thus, the bonding pad of the invention can assure good bonding between the bonding pad and a bonding wire. For example, a gold wire was bonded almost twice as strongly to a bonding pad of the invention that includes a tantalum layer as the diffusion barrier than to a bonding pad that does not include the diffusion barrier (see, for example, Examples 3 and 7). A semiconductor device, such as an LED or LD, that employs the bonding pad of the invention, therefore, can have good performance due to good and secure bonding between the bonding pad and a bonding wire.

DETAILED DESCRIPTION OF THE INVENTION

Figure 1:
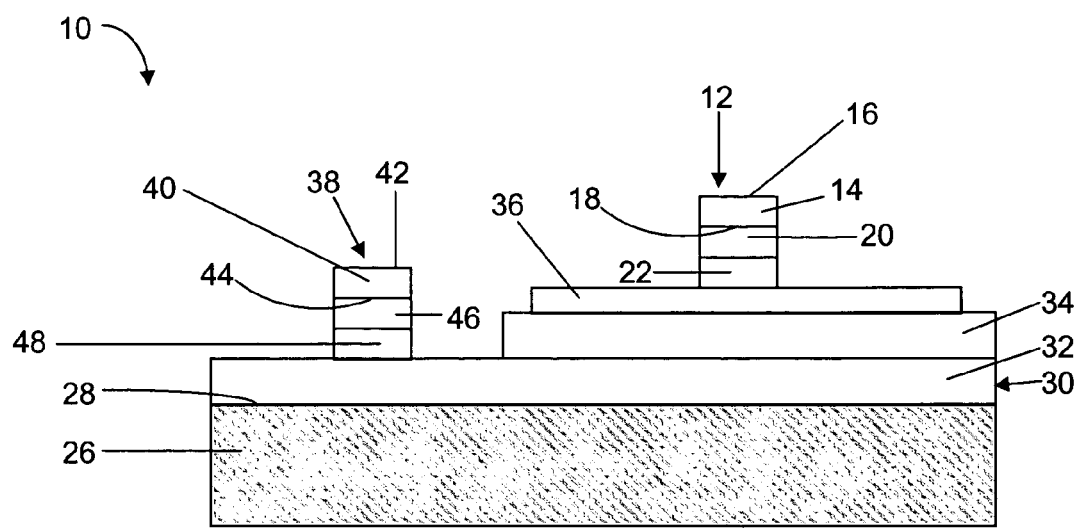
FIG. 1A is a cross-sectional view of semiconductor device 10 that includes p-side bonding pad 12 and n-side bonding pad 38, wherein n-side bonding pad 38 forms an ohmic contact with underlying n-type semiconductor layer 32.
FIG. 1B is a cross-sectional view of p-side bonding pad 12 that includes top gold layer 14, p-side diffusion barrier 20 and first 22a, second 22b and third 22c metal layers under p-side diffusion barrier 20.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

The present invention includes a semiconductor device having a p-side and/or n-side bonding pad that includes a diffusion barrier under a top layer of the bonding pad. The semiconductor device includes a substrate having a first major surface. Over the first major surface of the substrate is a semiconductor device structure that includes an n-type semiconductor layer and a p-type semiconductor layer over the n-type semiconductor layer. The semiconductor layers are preferably nitride-based semiconductor materials, more preferably gallium nitride-based semiconductor materials.

A p-side electrode and optionally an n-side electrode can be formed on the p-type and n-type semiconductor layers, respectively, by methods known to those skilled in the art (see, for example, U.S. Pat. No. 6,734,091, the entire teachings of which are incorporated herein by reference). The p-side and n-side electrodes are in electrical contact with the p-type and n-type semiconductor layers, respectively.

Herein, the bonding pad for the p-side semiconductor material or p-side electrode is referred to as a p-side bonding pad, and a bonding pad for the n-type semiconductor material or an n-side electrode over the n-type semiconductor material as an n-side bonding pad. The p-side bonding pad typically is formed on the p-side electrode. The n-side bonding pad typically is formed on the n-type semiconductor layer. In this case, the n-side bonding pad forms a good ohmic contact with the underlying n-type semiconductor layer.

The top layer of the bonding pad can be a layer of any metallic material that is inert to air oxidation and can form a good bonding with a bonding wire such as a gold wire. Preferably, a gold layer is the top layer of the bonding pad.

As used herein, the phrase "diffusion barrier" refers to a barrier that prevents undesirable diffusion and interaction between materials in its adjacent layers. The diffusion barrier in the present invention particularly is to impede diffusion of the metal elements of the underlying layers of the diffusion barrier to a top surface of the bonding pad, which can occur during various fabrication processes of a semiconductor device, including a high temperature annealing process. The diffusion barrier includes a single or multiple layers of a metallic material. Suitable examples of the metallic material include tungsten, tantalum, molybdenum, chromium, titanium and a mixture thereof. Multiple layers of the metallic material for the diffusion barrier can be separated by a single or multiple layers of gold. In a preferred embodiment, the diffusion barrier is a tantalum layer. As with the bonding pad, a diffusion barrier for a p-side bonding pad is referred to as a p-side diffusion barrier, and a diffusion barrier for an n-side bonging pad as an n-side diffusion barrier.

The thickness of each of the p-side and n-side diffusion barrier is in a range of between about 10 Å and about 3000 Å, preferably between about 10 Å and about 1000 Å, more preferably between about 10 Å and about 500 Å, even more preferably between about 50 Å and about 500 Å.

The bonding pad can contain more than one diffusion barrier.

In one embodiment of the invention shown in FIG. 1A, semiconductor device 10 comprises p-side bonding pad 12 that includes top gold layer 14 having first 16 and second surface 18, where first surface 16 is the top surface of p-side bonding pad 12 and a single or multiple layers of p-side diffusion barrier 20 are in contact with second surface 18 of top gold layer 14. Preferably, p-side diffusion barrier 20 is a single or multiple layers of tungsten, tantalum, molybdenum, chromium, titanium or a mixture thereof. More preferably, p-side diffusion barrier 20 is a tantalum layer. When the p-side diffusion barrier 20 includes multiple layers of the metallic material, the multiple layers of the metallic material for the p-side diffusion barrier 20 can be separated by a single or multiple layers of gold. Optionally, the bonding pad can further include one or more metal layers 22 under diffusion barrier 20, at least one of the metal layers being in contact with a surface of p-side electrode 36. Preferably, each of the metal layers is a layer of gold, palladium, aluminum or a mixture thereof. P-side bonding pad 12 is in electrical contact with p-side electrode 36.

In one embodiment, semiconductor device 10 can be prepared by first, providing substrate 26 having first major surface 28; forming semiconductor device structure 30 over first surface 28 of substrate 26. Semiconductor device structure 30 includes n-type semiconductor layer 32 and p-type semiconductor layer 34. P-side electrode 36 is formed on p-type semiconductor layer 34. P-side bonding pad 12 is then formed over p-side electrode 36. Methods and materials for forming the substrate, semiconductor device structure and p-side electrode are well-known in the art. Examples of such methods and materials can be seem in U.S. Pat. No. 6,734,091 and U.S. Publication Nos. 2003/0222263 and 2004/0000672, the entire teachings of which are incorporated herein by reference.

In a specific embodiment, the p-side bonding pad is formed by depositing p-side diffusion barrier 20 on p-side electrode 36; and then depositing gold layer 14 on p-side diffusion barrier 20. When the p-side diffusion barrier 20 includes multiple layers of the metallic material, a single or multiple layers of gold are formed between the multiple layers of the metallic material for the p-side diffusion barrier 20.

Figure 1B:
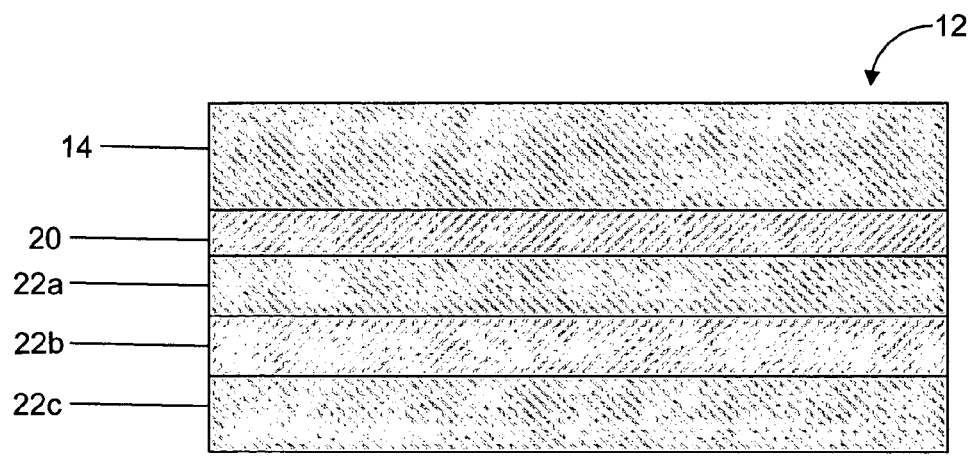

In another specific embodiment, where semiconductor device 10 further includes one or more metal layers 22 under p-side diffusion barrier 20, metal layers 22 are deposited on p-side electrode 36 prior to forming p-side diffusion barrier 20. After p-side diffusion barrier 20 is deposited on a top layer of metal layers 22, top gold layer 14 is deposited on p-side diffusion barrier 20. In a specific example, p-side bonding pad 12 has a first metal layer under p-side diffusion barrier 20. In another specific example, metal layers 22 include a first and second metal layers, where the second metal layer is under the first metal layer that is under p-side diffusion barrier 20. Preferably, as shown in FIG. 1B, metal layers 22 include first 22a, second 22b and third 22c metal layers, where third metal layer 22c is under second metal layer 22b that is under first metal layer 22a, and first metal layer 22a is under p-side diffusion barrier 20.

For example, in the preparation of the device having first 22a, second 22b and third 22c metal layers under p-side diffusion barrier 20, third metal layer 22c is deposited on p-side electrode 36, second metal layer 22b is deposited on third metal layer 22c and first metal layer 22a is deposited on second metal layer 22b. P-side diffusion barrier 20, preferably a tantalum layer, is then deposited on first metal layer 22a, and finally top gold layer 14 is deposited on p-side diffusion barrier 20. Preferably, the first metal layer is a gold layer, the second metal layer is an aluminum layer, and the third metal layer is a palladium layer.

Referring back to FIG. 1A, p-side bonding pad 12 that includes p-side diffusion barrier 20 and top gold layer 14 and optionally one or metal layers 22 subsequently is annealed.

In another embodiment of the invention, the semiconductor device includes p-side bonding pad 12 as described above and further n-side bonding pad 38 that is on an n-side electrode (not shown) or directly on a surface of n-type semiconductor layer 32. Preferably, n-side bonding pad 38 is directly on n-type semiconductor layer 32, as shown in FIG. 1A, and n-side bonding pad 38 forms a good ohmic contact with n-type semiconductor layer 32 (see, for example, Examples 4–6). The phrase "ohmic contact," as used herein, refers to a region where two materials are in contact, which has the property that the current flowing through the region is proportional to the potential difference across the region.

In a preferred embodiment, n-side bonding pad 38 is directly on a surface of n-type semiconductor 32, and includes top gold layer 40 having first 42 and second 44 surface, where first surface 42 is the top surface of n-side bonding pad 38; a single or multiple layers of n-side diffusion barrier 46 in contact with second surface 44 of top gold layer 40; and optionally one or more metal layers 48 under n-side diffusion barrier 46, at least one of metal layers 48 being in contact with the a surface of n-type semiconductor layer 32. Preferably, n-side diffusion barrier 46 is a single or multiple layers of tungsten, tantalum, molybdenum, chromium, titanium or a mixture thereof. More preferably, n-side diffusion barrier 46 is a tantalum layer. When the n-side diffusion barrier 46 includes multiple layers of the metallic material, the multiple layers of the metallic material for the n-side diffusion barrier 46 can be separated by a single or multiple layers of gold. Preferably, each of metal layers 48 is a layer of gold, palladium, aluminum or a mixture thereof.

In a more preferred embodiment, n-side bonding pad 38 is formed independently from p-side bonding pad 12, but in a similar manner as the preparation of p-side bonding pad 12. Namely, n-side diffusion barrier 46 is deposited on n-type semiconductor layer 32, and top gold layer 40 is deposited on n-side diffusion barrier 46. When the n-side diffusion barrier 46 includes multiple layers of the metallic material, a single or multiple layers of gold are formed between the multiple layers of the metallic material for the n-side diffusion barrier 46.

In another more preferred embodiment where semiconductor device 10 further includes one or more metal layers 48 under n-side diffusion barrier 46, metal layers 48 are deposited on n-type semiconductor layer 32 prior to forming n-side diffusion barrier 46. After n-side diffusion barrier 46 is deposited on a top layer of metal layers 48, top gold layer 40 is deposited on n-side diffusion barrier 46. In a specific example, n-side bonding pad 38 has a first metal layer under n-side diffusion barrier 46. In another specific example, n-side bonding pad 38 includes a first and second metal layers under n-side diffusion barrier 46, where the second metal layer is under the first metal layer that is under n-side diffusion barrier 46 or preferably includes a first, second and third metal layers, where the third metal layer is under the second metal layer that is under the first metal layer and the first metal layer is under n-side diffusion barrier 46.

For example, in the preparation of the device having a first, second and third metal layers under n-side diffusion barrier 46, the third metal layer is deposited on n-type semiconductor layer 32, the second metal layer is deposited on the third metal layer and the first metal layer is deposited on the second metal layer. N-side diffusion barrier 46, preferably a tantalum layer, is then deposited on the first metal layer, and finally top gold layer 40 is deposited on n-side diffusion barrier 46. Preferably, the first metal layer is a gold layer, the second metal layer is an aluminum layer, and the third metal layer is a palladium layer.

N-side bonding pad 38 that includes n-side diffusion barrier 46 and top gold layer 40 and optionally one or more metal layers 48 is subsequently annealed.

In yet another embodiment, the semiconductor device of the invention comprises p-side bonding pad 12 and n-side bonding pad 38, as described above, and each of which includes the same set of materials. In this embodiment, optionally, the materials for the p-side bonding pad 12 and n-side bonding pad 38 can be deposited simultaneously. For example, a single or multiple layers of a diffusion barrier material, preferably a tantalum layer, is deposited simultaneously on p-side electrode 36 and n-type semiconductor layer 32. A top gold layer is then deposited on the diffusion barrier layer. Similarly, in another example, one or more metal layers can be deposited simultaneously on p-side electrode 36 and n-type semiconductor layer 32. A single or multiple layers of a diffusion barrier material, preferably a tantalum layer, is then deposited on a top layer of the metal layers. When the semiconductor device includes multiple layers of the diffusion barrier material, a single or multiple layers of gold are formed between the multiple layers of the diffusion barrier material. A top gold layer is then deposited on the diffusion barrier layer. Selective masking and/or etching techniques known in the art can be used to provide individual p-side bonding pad 12 and n-side bonding pad 38.

The p-side and n-side bonding pads of the invention can be annealed simultaneously or independently from each other. Optionally, the p-side and/or n-side bonding pads and the p-side electrode can be annealed simultaneously.

During the annealing step for the p-side and/or n-side bonding pad of the invention, the bonding pads are heated to a temperature of about 400° C. or more but below the decomposition temperature of the semiconductor layers, for example, gallium nitride-based semiconductor layers, preferably in a range of between about 400° C. and about 600° C., more preferably between about 400° C. and about 550° C., for about 30 seconds to about 1 hour. The annealing treatment can be conducted in the presence of oxygen. The amount of oxygen present in the annealing environment may be as high as 100%. The annealing environment can be air or a controlled environment such as 65% oxygen/35% nitrogen. Alternatively, the annealing treatment can be conducted in a nitrogen environment or in a vacuum environment. The annealing step may be performed in a furnace, by rapid thermal annealing, or on a hot plate.

The materials for the bonding pad can be deposited on a semiconductor material or an electrode over a semiconductor material by thermal or E-beam evaporation, sublimation, metalorganic chemical vapor deposition or other techniques known to those skilled in the art.

As described above, in a preferred embodiment of the invention, the semiconductor device is a gallium nitride-based semiconductor device that includes a p-side boning pad over a p-side electrode. Preferably, the gallium nitride-based semiconductor device further includes an n-side bonding pad that is directly on a surface of an n-type semiconductor layer. The p-side and n-side bonding pads of the device are as described above.

A gallium nitride-based semiconductor material is a material having the formula $In_xAl_yGa_{1-x-y}N$, wherein x+y<1, $0 \leq x<1$, and $0 \leq y<1$. Gallium nitride-based semiconductor materials are usually grown by a vapor phase growth method such as metalorganic chemical vapor deposition (MOCVD or MOVPE, hydride chemical vapor deposition (HDCVD), or molecular beam epitaxy (MBE). Generally, a gallium nitride-based semiconductor material is an n-type material even when no n-type dopant is included in the material since nitrogen lattice vacancies are created during crystal growth. Thus, an n-type gallium nitride-based semiconductor material may not include an n-type dopant. However, an n-type gallium nitride-based semiconductor typically exhibits better conductivity when the material includes an n-type dopant. n-Type dopants for gallium nitride-based semiconductor materials include Group IV elements such as silicon, germanium and tin, and Group VI elements such as selenium, tellurium and sulfur.

A p-type gallium nitride-based semiconductor material is a gallium nitride-based semiconductor material that includes a p-type dopant. The p-type dopants (also called an acceptor) for gallium nitride-based semiconductor materials include Group II elements such as cadmium, zinc, beryllium, magnesium, calcium, strontium, and barium. Preferred p-type dopants are magnesium and zinc. Typically, during growth of the gallium nitride-based semiconductor material gaseous compounds containing hydrogen atoms are thermally decomposed to form the semiconductor material. The released hydrogen atoms, which are present mainly as protons, become trapped in the growing semiconductor material, and combine with p-type dopant, thereby inhibiting their acceptor function. To improve the conductivity of a p-type gallium nitride-based semiconductor material, the material may be placed in a high electric field, typically above 10,000 volts/cm for about 10 minutes or more. The protons trapped in the semiconductor material are drawn out of the material to the negative electrode, thereby activating the function of the p-type dopants (see, for example, U.S. Publication No. 2003/0199171, the entire teachings of which are incorporated herein by reference). Alternatively, the conductivity of the p-type gallium nitride-based semiconductor material can be improved by annealing the material at a temperature above 600° C. in a nitrogen environment for 10 minutes or more (see, for example, U.S. Pat. No. 5,306,662, the entire teachings of which are incorporated herein by reference).

As described above, a gallium nitride-based semiconductor structure includes an p-type gallium nitride-based semiconductor layer and n-type gallium nitride-based semiconductor layer. The p-type gallium nitride-based semiconductor layer is generally grown over the n-type gallium nitride-based semiconductor layer. The n-type and p-type semiconductor layers can be in direct contact with each other or, alternatively, an active region can be sandwiched between the n-type and p-type gallium nitride-based semiconductor layers. An active region can have a single quantum-well structure or a multiple quantum-well structure. An active region having a single quantum-well structure has a single layer (i.e., the well layer) formed of a gallium nitride-based semiconductor material having a lower band-gap than the n-type and p-type gallium nitride-based semiconductor layers sandwiching it. An active region having a multiple quantum-well structure includes multiple well layers alternately stacked with multiple layers that have a higher band-gap than the well layers (i.e., barrier layers). The outermost layer of the active region closest to the n-type gallium nitride-based semiconductor layer is a well layer and has a smaller band-gap than the n-type gallium nitride-based semiconductor layer. The outermost layer of the active region closest to the p-type gallium nitride-based semiconductor layer may be a well layer or a barrier layer and may have a band-gap that is larger or smaller than the p-type gallium nitride-based semiconductor layer. Typically, the thickness of a well layer in a quantum-well structure is about 70 Å or less, and the barrier layers are about 150 Å or less. Generally, the well layers and barrier layers in a quantum-well structure are not intentionally doped.

EXEMPLIFICATION

Example 1

Preparation of a P-side Bonding Pad That Include a Tantalum Diffusion Barrier

The p-side bonding pad was made of two layers. A tantalum layer (200 Å) was formed on the p-side electrode, and a gold layer(5000 Å) was then formed on top of the tantalum layer. The bonding pad was annealed at 500° C. in an oxygen environment for 15 minutes.

Example 2

Preparation of a P-side Bonding Pad That Include a Palladium, Aluminum and Gold Layers Under a Tantalum Diffusion Barrier The p-side bonding pad was made of 5 layers, palladium (100 Å), aluminum (50 Å), gold (1000 Å), tantalum (200 Å), and gold (4000 Å). The palladium layer (100 Å) was formed on the p-side electrode; the aluminum layer (50 Å) was formed on the palladium layer; the gold layer (1000 Å) was formed on the aluminum layer; and the tantalum layer (200 Å) was then formed on the gold layer. Subsequently, the 4000 Å thick gold layer was formed on the tantalum layer. The bonding pad was annealed at 500° C. in an oxygen environment for 15 minutes.

Example 3

A Ball-bond Shear Test on the P-side Bonding Pads of Example 1

Figure 2:
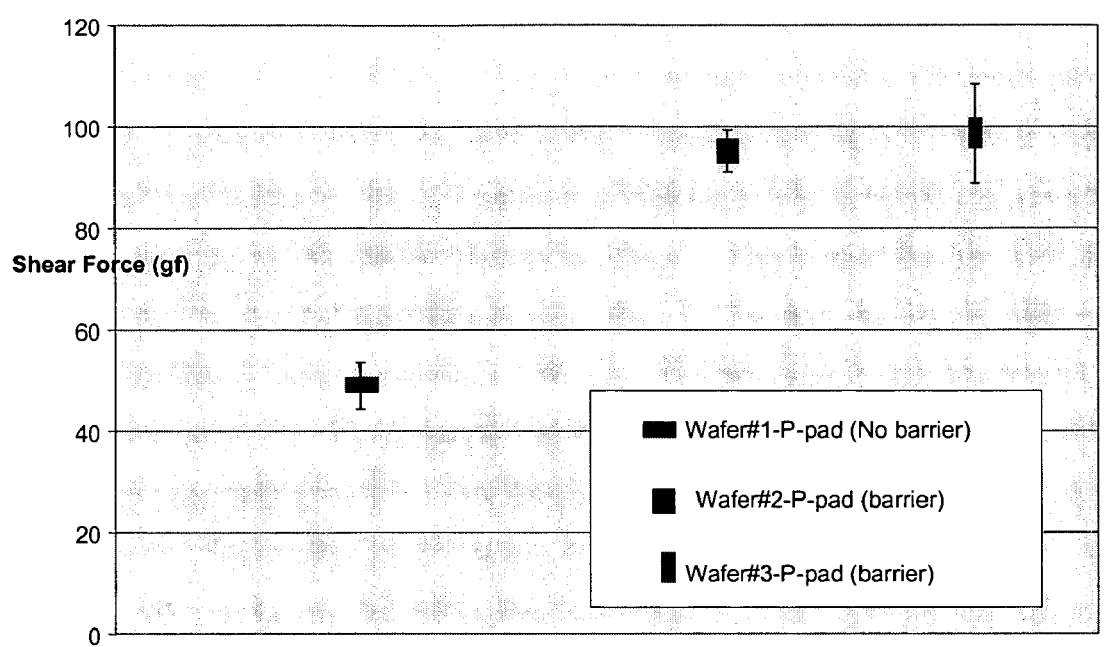
FIG. 2 is a graph showing ball bonding shear test results on p-side bonding pads formed by the method described in Example 1.

A ball-bond shear test known in the art was used to gauge the bonding strength of a gold wire to the bonding pads prepared as described in Example 1. A comparative test was also performed using a wafer that did not have a diffusion barrier. FIG. 2 shows the results of 10 individual tests for each wafer. For each wafer, the average value of 10 tests and the whole range (with max and min values) of 10 values were shown. Both wafer #2 and #3 refer to the bonding pads prepared as in Example 1.

As can be seen in FIG. 2, the gold wire bonding was much stronger to the bonding pads containing the tantalum diffusion barrier layer, which were prepared by the procedures in Example 1, as compared to that of the comparative test.

Example 4

Preparation of an N-side Bonding Pad That Include a Tantalum Diffusion Barrier The n-side bonding pad was made of two layers. A tantalum layer (200 Å) was formed on the n-type GaN layer and a gold layer (5000 Å) was then formed on top of the tantalum layer. The bonding pad was annealed at 500° C. in an oxygen environment for 15 minutes.

Example 5

Preparation of an N-side Bonding Pad That Include a Palladium, Aluminum and Gold Layers Under a Tantalum Diffusion Barrier The n-side bonding pad was made of 5 layers, palladium (100 Å), aluminum (50 Å), gold (1000 Å), tantalum (200 Å), and gold (4000 Å). The palladium layer (100 Å) was formed on the n-type GaN layer; the aluminum layer (50 Å) was formed on the palladium layer; the gold layer (1000 Å) was formed on the aluminum layer; and the tantalum layer (200 Å) was then formed on the gold layer. Subsequently, the 4000 Å thick gold layer was formed on the tantalum layer. The bonding pad was annealed at 500° C. in an oxygen environment for 15 minutes.

Example 6

Figure 3:
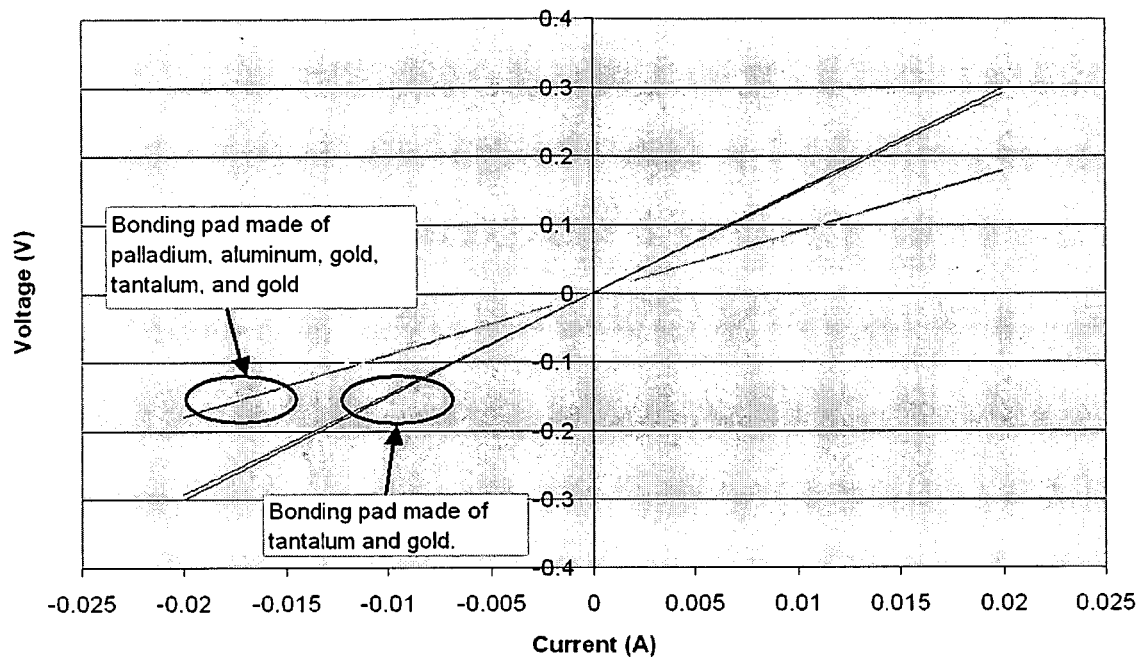
FIG. 3 is a graph showing current vs. voltage of two different types of bonding pads formed by the methods described in Examples 4 and 5, illustrating the formation of a good ohmic contact to an n-type semiconductor layer.

An Ohmic Contact Test of the N-side Bonding Pads of Examples 4 and 5 with an Underlying N-type Semiconductor Layer Current vs. voltage curves were plotted in FIG. 3. Three individual tests were performed on the n-side bonding pad prepared as described in Example 4. Similarly, three individual tests were preformed on the n-side bonding pad prepared as described in Example 5. As can be seen in FIG. 3, the current-voltage curves are linear for the both two different n-side bonding pads independently prepared as described in Examples 4 and 5, indicating that each of the n-side bonding pads formed an ohmic contact with each of the underlying n-type GaN semiconductor layers. For this measurement, the samples were annealed in an environment containing oxygen at 500° C. for 15 minutes. The measurement was taken by probing two adjacent bonding pads separated from each other by 200 μm. The bonding pad size was 90 μm by 90 μm.

Example 7

A Ball-bond Shear Test on the N-side Bonding Pads of Example 4

Figure 4:
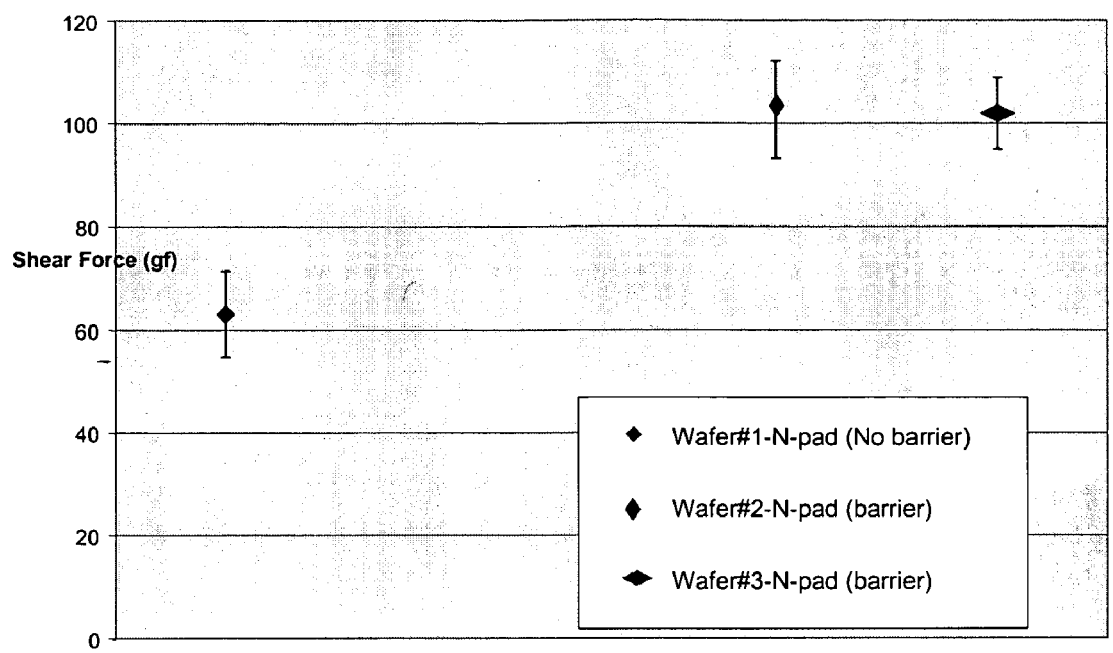
FIG. 4 is a graph showing ball bonding shear test results on n-side bonding pads formed by the method described in Example 4.

In a similar manner as that of Example 3, a ball-bond shear test was used to gauge the bonding strength of a gold wire to the bonding pads prepared as described in Example 4. A comparative test was also performed using a wafer that did not have a diffusion barrier. FIG. 4 shows the results of 10 individual tests for each wafer. For each wafer, the average value of 10 tests and the whole range (with max and min values) of 10 values were shown. Both wafer #2 and #3 refer to the bonding pads prepared as in Example 4.

As can be seen in FIG. 4, the gold wire bonding was much stronger to the bonding pads containing the tantalum diffusion barrier layer, which were prepared by the procedure in Example 4, as compared to that of the comparative test.

Equivalents

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor device, comprising:
   a) a substrate having a first major surface;
   b) a semiconductor device structure over the first major surface of the substrate, the device structure comprising a nitride-based n-type semiconductor layer, and a nitride-based p-type semiconductor layer over the n-type semiconductor layer;
   c) a p-side electrode having a first and a second surface, wherein the first surface is in electrical contact with the p-type semiconductor layer; and
   d) a p-side bonding pad that is in contact with the second surface of the p-side electrode, and that includes:
      i) a top gold layer having a first and a second surface, wherein the first surface is the top surface of the p-side bonding pad; and
      ii) a single or multiple layers of a p-side diffusion barrier in contact with the second surface of the top gold layer, wherein the p-side diffusion barrier is a single or multiple layers of tungsten, tantalum, molybdenum, chromium, titanium or a mixture thereof, wherein the p-side bonding pad further comprises one or more metal layers under the p-side diffusion barrier, at least one of said metal layers being in contact with the second surface of the p-side electrode and wherein each of the metal layers under the p-side diffusion barrier is independently selected from the group consisting of gold, palladium, aluminum and a mixture thereof.

2. The device of claim 1, wherein the p-side diffusion barrier is a tantalum layer.

3. The device of claim 2, further including a second gold layer under the tantalum layer.

4. The device of claim 3, further including an aluminum layer under the second gold layer.

5. The device of claim 4, further including a palladium layer under the aluminum layer.

6. A semiconductor device, comprising:
   a) a substrate having a first major surface;
   b) a semiconductor device structure over the first major surface of the substrate, the device structure comprising a nitride-based n-type semiconductor layer, and a nitride-based p-type semiconductor layer over the n-type semiconductor layer;
   c) a p-side electrode having a first and a second surface, wherein the first surface is in electrical contact with the p-type semiconductor layer;
   d) a p-side bonding pad that is in contact with the second surface of the p-side electrode, and that includes:
      i) a top gold layer having a first and a second surface, wherein the first surface is the top surface of the p-side bonding pad; and
      ii) a single or multiple layers of a p-side diffusion barrier in contact with the second surface of the top gold layer, wherein the p-side diffusion barrier is a single or multiple layers of tungsten, tantalum, molybdenum, chromium, titanium or a mixture thereof; and
   e) an n-side bonding pad that is directly on a surface of the n-type semiconductor layer and forms an ohmic contact with the underlying n-type semiconductor, wherein the n-side bonding pad includes:
      i) a top gold layer having a first and a second surface, wherein the first surface is the top surface of the n-side bonding pad; and
      ii) a single or multiple layers of an n-side diffusion barrier in contact with the second surface of the top gold layer.

7. The device of claim 6, wherein the n-side diffusion barrier is a single or multiple layers of tungsten, tantalum, molybdenum, chromium, titanium or a mixture thereof.

8. The device of claim 7, wherein the n-side diffusion barrier includes multiple layers, and wherein said multiple layers of the n-side diffusion barrier are separated by a single or multiple layers of gold.

9. The device of claim 7, wherein the n-side diffusion barrier is a tantalum layer.

10. The device of claim 9, wherein the thickness of the n-side diffusion barrier is in a range of between about 10 Å to about 3000 Å.

11. The device of claim 10, wherein the thickness of the n-side diffusion barriers is in a range of between about 50 Å to about 500 Å.

12. The device of claim 7, wherein the n-side bonding pad further comprises one or more metal layers under the n-side diffusion barrier, at least one of said metal layers being in contact with a surface of the n-type semiconductor layer.

13. The device of claim 12, wherein each of the metal layers under the n-side diffusion barrier is independently selected from the group consisting of gold, palladium, aluminum and a mixture thereof.

14. The device of claim 13, wherein the n-side diffusion barrier is a tantalum layer.

15. The device of claim 14, further including a second gold layer under the tantalum layer.

16. The device of claim 15, further including an aluminum layer under the second gold layer.

17. The device of claim 16, further including a palladium layer under the aluminum layer.

18. A semiconductor device, comprising:
    a) a substrate having a first major surface;
    b) a semiconductor device structure over the first major surface of the substrate, the device structure comprising an n-type gallium nitride-based semiconductor layer, and a p-type gallium nitride-based semiconductor layer over the n-type semiconductor layer;
    c) a p-side electrode having a first and a second surface, wherein the first surface of the p-side electrode is in electrical contact with the p-type semiconductor layer; and
    d) a p-side bonding pad that is in contact with the second surface of the p-side electrode, comprising:
       i) a top gold layer having a first and a second surface, wherein the first surface is the top surface of the p-side bonding pad;
       ii) a single or multiple layers of a p-side diffusion barrier in contact with the second surface of the top gold layer, wherein the p-side diffusion barrier includes at least one element selected from the group consisting of tungsten, tantalum, molybdenum, and chromium; and
       iii) optionally one or more metal layers under the p-side diffusion barrier, wherein each of the metal layers independently is selected from the group consisting of gold, palladium, aluminum and a mixture thereof.

19. The device of claim 18, wherein the p-side diffusion barrier includes multiple layers, and wherein said multiple layers of the p-side diffusion barrier are separated by a single or multiple layers of gold.

20. The device of claim 18, further comprising an n-side bonding pad that is directly on a surface of the n-type semiconductor layer and forms an ohmic contact with the underlying n-type semiconductor, wherein the n-side bonding pad includes:
    i) a top gold layer having a first and a second surface, wherein the first surface is the top surface of the n-side bonding pad; and
    ii) a single or multiple layers of an n-side diffusion barrier in contact with the second surface of the top gold layer of the n-side bonding pad, wherein the n-side diffusion barrier includes at least one element selected from the group consisting of tungsten, tantalum, molybdenum, chromium and titanium; and
    iii) optionally one or more metal layers under the n-side diffusion barrier, each of the metal layers independently selected from the group consisting of gold, palladium, aluminum and a mixture thereof.

21. The device of claim 20, wherein the n-side diffusion barrier includes multiple layers, and wherein said multiple layers of the n-side diffusion barrier are separated by a single or multiple layers of gold.

22. The device of claim 20, wherein each of the diffusion barriers of the n-side and p-side bonding pads is a tantalum layer.

23. The device of claim 22, wherein the n-side bonding pad and/or p-side bonding pad each independently further includes:
- a second gold layer under the tantalum layer;
- an aluminum layer under the second gold layer; and
- a palladium layer under the aluminum layer.

24. A semiconductor device, comprising:
a) a substrate having a first major surface;
b) a semiconductor device structure over the first major surface of the substrate, the device structure comprising an n-type semiconductor layer, and a p-type semiconductor layer over the n-type semiconductor layer;
c) a p-side electrode having a first and a second surface, wherein the first surface is in electrical contact with the p-type semiconductor layer; and
d) a p-side bonding pad that is in contact with the second surface of the p-side electrode, and that includes:
  i) a top gold layer having a first and a second surface, wherein the first surface is the top surface of the p-side bonding pad; and
  ii) a single or multiple layers of a p-side diffusion barrier in contact with the second surface of the top gold layer, wherein the p-side diffusion barrier is a single or multiple layers of tungsten, tantalum, molybdenum, chromium, titanium or a mixture thereof,
wherein the p-side bonding pad further comprises one or more metal layers under the p-side diffusion barrier, at least one of said metal layers being in contact with the second surface of the p-side electrode and wherein each of the metal layers under the p-side diffusion barrier is independently selected from the group consisting of gold, palladium, aluminum and a mixture thereof.

25. A semiconductor device, comprising:
a) a substrate having a first major surface;
b) a semiconductor device structure over the first major surface of the substrate, the device structure comprising an n-type semiconductor layer, and a p-type semiconductor layer over the n-type semiconductor layer;
c) a p-side electrode having a first and a second surface, wherein the first surface is in electrical contact with the p-type semiconductor layer; and
d) an n-side bonding pad that is directly on a surface of the n-type semiconductor layer and forms an ohmic contact with the underlying n-type semiconductor, wherein the n-side bonding pad includes:
  i) a top gold layer having a first and a second surface, wherein the first surface is the top surface of the n-side bonding pad; and
  ii) a single or multiple layers of an n-side diffusion barrier in contact with the second surface of the top gold layer, wherein the n-side diffusion barrier is a single or multiple layers of tungsten, tantalum, molybdenum, chromium, titanium or a mixture thereof.

* * * * *